United States Patent

Morikazu et al.

(10) Patent No.: US 9,735,040 B2
(45) Date of Patent: Aug. 15, 2017

(54) METHOD OF PROCESSING SINGLE-CRYSTAL SUBSTRATE

(71) Applicant: DISCO CORPORATION, Tokyo (JP)

(72) Inventors: Hiroshi Morikazu, Tokyo (JP); Noboru Takeda, Tokyo (JP); Takumi Shotokuji, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/068,141

(22) Filed: Mar. 11, 2016

(65) Prior Publication Data

US 2016/0268155 A1    Sep. 15, 2016

(30) Foreign Application Priority Data

Mar. 12, 2015    (JP) .................................. 2015-049985

(51) Int. Cl.
  *B23K 26/00*    (2014.01)
  *H01L 21/683*    (2006.01)
  *H01L 21/78*    (2006.01)

(52) U.S. Cl.
  CPC .......... *H01L 21/6836* (2013.01); *H01L 21/78* (2013.01); *H01L 2221/6834* (2013.01); *H01L 2221/68327* (2013.01); *H01L 2221/68386* (2013.01)

(58) Field of Classification Search
  CPC ........................... B23K 26/00; H01L 21/67092
  See application file for complete search history.

(56) References Cited

U.S. PATENT DOCUMENTS

| 5,486,264 A | 1/1996 | Ghandour |
| 6,665,050 B2 | 12/2003 | Shiraishi |
| 6,992,026 B2 | 1/2006 | Fukuyo et al. |
| (Continued) | | |

FOREIGN PATENT DOCUMENTS

| JP | 10-305420 | 11/1998 |
| JP | 2002-192370 | 7/2002 |
| (Continued) | | |

OTHER PUBLICATIONS

Berthold A, et al, Proceedings of the SeSens Workshop, (2010) pp. 613-616.

(Continued)

*Primary Examiner* — Mohammad Choudhry
(74) *Attorney, Agent, or Firm* — Greer Burns & Crain, Ltd.

(57) ABSTRACT

A method of dividing a single-crystal substrate along a plurality of preset division lines, includes a shield tunnel forming step of applying a pulsed laser beam having such a wavelength that permeates through the substrate along the division lines to form shield tunnels, each including a fine hole and an amorphous region shielding the fine hole, a protective member adhering step of adhering a protective member to the substrate before or after the shield tunnel forming step, and a grinding step of holding the protective member on the substrate, to which the shield tunnel forming step and the protective member adhering step are performed, on a chuck table of a grinding apparatus, grinding a reverse surface of the substrate to bring the substrate to a predetermined thickness, and dividing the substrate along the division lines along which the shield tunnels have been formed.

15 Claims, 10 Drawing Sheets

(56) References Cited

U.S. PATENT DOCUMENTS

| | | |
|---|---|---|
| 9,130,057 B1 | 9/2015 | Kumar et al. |
| 9,209,591 B2 | 12/2015 | Takeda et al. |
| 9,305,793 B2 | 4/2016 | Morikazu et al. |
| 9,349,646 B2 | 5/2016 | Morikazu et al. |
| 2004/0002199 A1 | 1/2004 | Fukuyo et al. |
| 2004/0112880 A1 | 6/2004 | Sekiya |
| 2004/0266146 A1* | 12/2004 | Jung ............... H01L 21/2026 438/487 |
| 2005/0272223 A1 | 12/2005 | Fujii et al. |
| 2006/0105544 A1 | 5/2006 | Takanashi et al. |
| 2007/0004179 A1 | 1/2007 | Nakamura et al. |
| 2008/0050905 A1* | 2/2008 | Uchida ............... H01L 24/03 438/614 |
| 2008/0233719 A1* | 9/2008 | Omata ........... H01L 21/02532 438/487 |
| 2009/0266802 A1 | 10/2009 | Sawabe et al. |
| 2009/0283127 A1 | 11/2009 | Juso et al. |
| 2009/0298263 A1* | 12/2009 | Watanabe ........ B23K 26/0057 438/463 |
| 2010/0136766 A1 | 6/2010 | Sakamoto et al. |
| 2013/0126573 A1 | 5/2013 | Hosseini et al. |
| 2014/0248757 A1 | 9/2014 | Morikazu et al. |
| 2014/0334511 A1 | 11/2014 | Takeda et al. |

FOREIGN PATENT DOCUMENTS

| | | |
|---|---|---|
| JP | 2003-163323 | 6/2003 |
| JP | 2007-067082 | 3/2007 |
| JP | 2007-330985 | 12/2007 |

OTHER PUBLICATIONS

U.S. Appl. No. 14/188,896, filed Feb. 25, 2014.
U.S. Appl. No. 14,185,189, filed Feb. 20, 2014.
U.S. Appl. No. 15/057,428, filed Mar. 1, 2016.
U.S. Appl. No. 14/276,571, filed May 13, 2014.

* cited by examiner

METHOD OF PROCESSING SINGLE-CRYSTAL SUBSTRATE

BACKGROUND OF THE INVENTION

Field of the Invention

The present invention relates to a method of processing a single-crystal substrate such as a sapphire ($Al_2O_3$) substrate, a silicon carbide (SiC) substrate, a gallium nitride (GaN) substrate, a lithium tantalate ($LiTaO_3$) substrate, a lithium niobate ($LiNbO_3$) substrate, a diamond substrate, a quartz substrate, or the like.

Description of the Related Art

In an optical device fabrication process, an optical device layer made up of an n-type nitride semiconductor layer and a p-type nitride semiconductor layer is stacked on the surface of a sapphire ($Al_2O_3$) substrate, a silicon carbide (SiC) substrate, or a gallium nitride (GaN) substrate, and optical devices such as light-emitting diodes, laser diodes, or the like are formed in a plurality of regions divided by a plurality of division lines formed in a grid pattern on the optical device layer, thereby producing an optical device wafer. Then, a laser beam is applied to the optical device wafer along the division lines to cut the optical device wafer, dividing the regions with the optical devices formed therein thereby to manufacture individual optical devices. A SAW wafer with SAW devices formed on the surface of a lithium tantalate ($LiTaO_3$) substrate, a lithium niobate ($LiNbO_3$) substrate, a silicon carbide (SiC) substrate, a diamond substrate, or a quartz substrate is also cut into individual SAW devices by a laser beam applied to the SAW wafer along division lines.

As a method of dividing wafers such as optical device wafers and SAW wafers as described above, there has been tried a laser processing method that uses a pulsed laser beam having such a wavelength that permeates through a workpiece, wherein the pulsed laser beam is applied to the workpiece while positioning a converged point thereof within an area to be divided. A dividing process using such a laser processing method is a technology for dividing a wafer by applying a pulsed laser beam having such a wavelength that permeates through the wafer from one surface thereof while positioning a converged point thereof within the wafer thereby to form a succession of modified layers serving as rupture start points along a division line within the workpiece and exerting an external force on the wafer along a street where the strength is lowered by the modified layers (see, for example, Japanese Patent No. 3408805).

Furthermore, as a method of dividing a wafer such as a semiconductor wafer, an optical device wafer, or the like along a division line, there has been put to practical use a technology for performing an ablation process on a wafer by irradiating the wafer with a pulsed laser beam having a wavelength absorbable by the wafer along a division line thereby to form laser-processed grooves, and exerting an external force on the wafer along the division line where the laser-processed grooves have been formed as rupture start points, thereby splitting the wafer (see, for example, Japanese Patent Laid-Open No. Hei10-305420).

SUMMARY OF THE INVENTION

However, either one of the above processing methods is problematic in that the productivity is poor because in order to divide an optical device wafer made of a sapphire ($Al_2O_3$) substrate or the like along a division line, it is necessary to apply a laser beam to the same division line a plurality of times, resulting in a reduction in the productivity.

When a laser beam is applied to a wafer in the form of a single-crystal substrate along division lines after the reverse side of the wafer has been ground to reduce the thickness of the wafer, the number of times that the laser beam is applied is reduced, thereby solving the above problems. However, a reduction in the thickness of the wafer that includes a single-crystal substrate tends to cause the wafer to buckle, making the converged point of the laser beam unstable and hence making it hard to process the wafer appropriately.

It is therefore an object of the present invention to provide a method of processing a single-crystal substrate efficiently and appropriately with a laser beam along division lines set on the single-crystal substrate.

In accordance with an aspect of the present invention, there is provided a method of processing a single-crystal substrate to divide the single-crystal substrate along a plurality of preset division lines, including a shield tunnel forming step of applying a pulsed laser beam having such a wavelength that permeates through the single-crystal substrate to the single-crystal substrate along the division lines to form shield tunnels, each including a fine hole and an amorphous region shielding the fine hole, in the single-crystal substrate along the division lines, a protective member adhering step of adhering a protective member to the single-crystal substrate before or after the shield tunnel forming step, and a grinding step of holding the protective member on the single-crystal substrate, to which the shield tunnel forming step and the protective member adhering step are performed, on a chuck table of a grinding apparatus, grinding a reverse surface of the single-crystal substrate to bring the single-crystal substrate to a predetermined thickness, and dividing the single-crystal substrate along the division lines along which the shield tunnels have been formed.

Preferably, the pulsed laser beam used in the shield tunnel forming step has a peak energy density set to a value in a range from 1 $TW/cm^2$ to 100 $TW/cm^2$.

In the method of processing a single-crystal substrate according to the present invention, the pulsed laser beam having such a wavelength that permeates through the single-crystal substrate is applied to the single-crystal substrate along the division lines to form shield tunnels, each including a fine hole and an amorphous region shielding the fine hole, in the single-crystal substrate along the division lines, and a protective member is adhered to the single-crystal substrate before or after the shield tunnels are formed in the single-crystal substrate. Then, after the shield tunnels have been formed and the protective member has been adhered, the protective member on the single-crystal substrate is held on a chuck table of a grinding apparatus, and a reverse surface of the single-crystal substrate is ground to bring the single-crystal substrate to a predetermined thickness, after which the single-crystal substrate is divided along the division lines along which the shield tunnels have been formed. It is not necessary to apply the pulsed laser beam to each of the division lines a plurality of times to, resulting in an increase in the productivity. As the shield tunnels are formed before the reverse side of the single-crystal substrate is ground to bring the single-crystal substrate to a predetermined thickness, the single-crystal substrate is prevented from buckling and can be processed appropriately by the pulsed laser beam.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
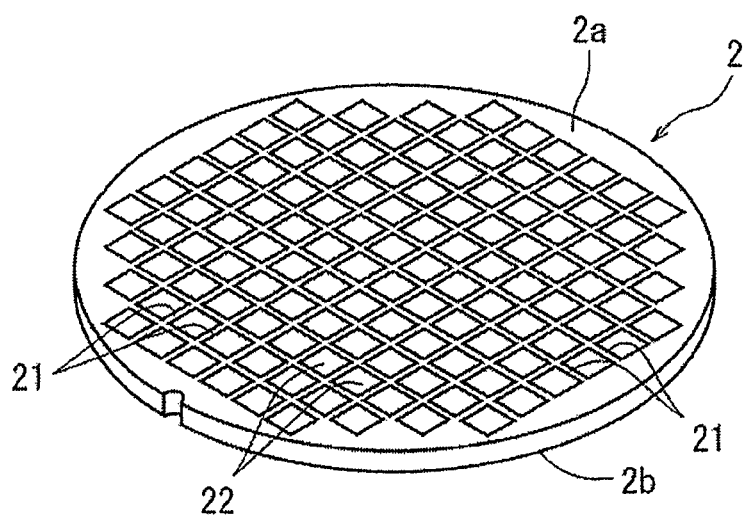
FIG. 1 is a perspective view of an optical device wafer.

A method of processing a single-crystal substrate according to a preferred embodiment of the present invention will be described in detail below with reference to the accompanying drawings. FIG. 1 shows in perspective an optical device wafer as a single-crystal substrate which is to be processed by a method of processing a single-crystal substrate according to the present invention.

An optical device wafer 2 shown in FIG. 1 includes a sapphire ($Al_2O_3$) substrate in the form of a single-crystal substrate having a thickness of 400 μm, and has an optical device layer made up of an n-type gallium nitride semiconductor layer and a p-type gallium nitride semiconductor layer and deposited on a surface 2a thereof. The optical device layer includes a matrix of optical devices 22 formed individually in a plurality of areas that are separated by division lines 21 formed in a grid pattern. A method of processing a wafer to divide the optical device wafer 2 along the division lines 21 into individual optical devices 22 will be described below.

Figure 2A:
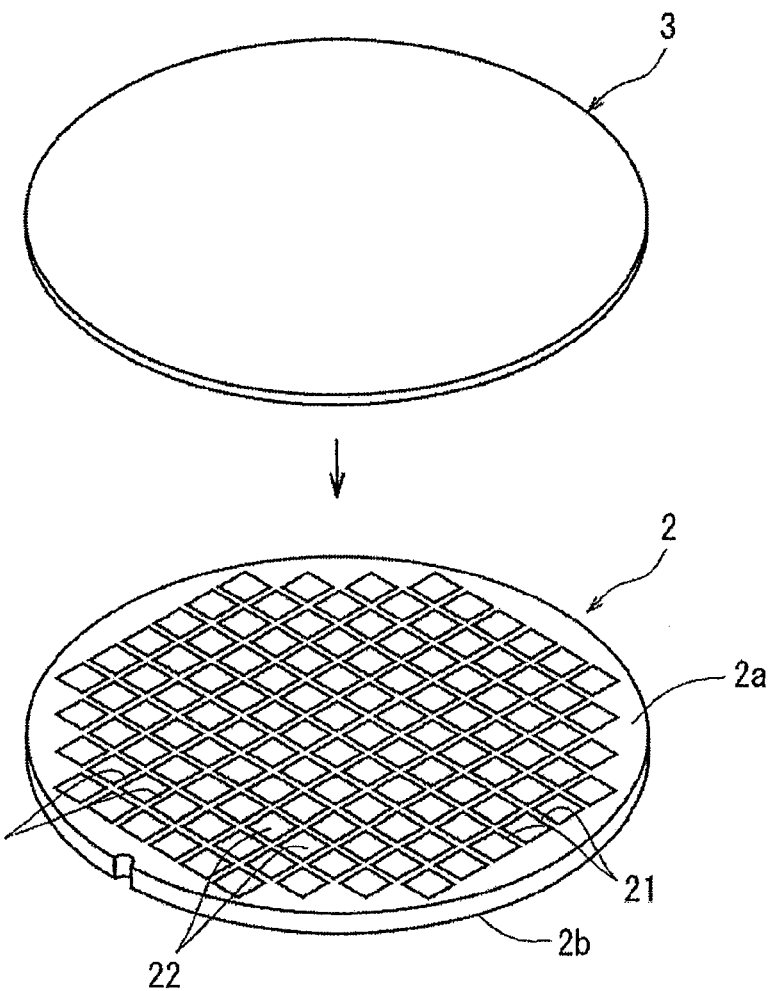
FIGS. 2A and 2B are views illustrating a protective member adhering step.
Figure 2B:
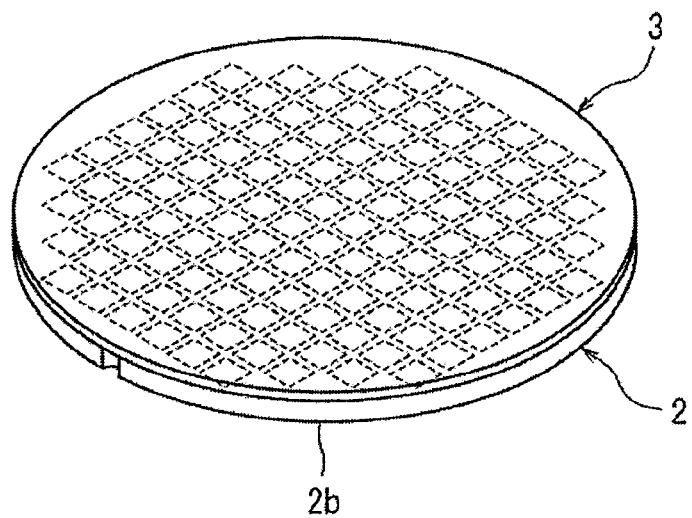

First, in order to protect the optical devices 22 formed on the surface 2a of the optical device wafer 2, a protective member adhering step is carried out to adhere a protective member to the surface 2a of the optical device wafer 2. Specifically, as shown in FIGS. 2A and 2B, a protective tape 3 as the protective member is adhered to the surface 2a of the optical device wafer 2. According to the present embodiment, the protective tape 3 includes a sheet-like base of polyvinyl chloride (PVC) having a thickness of 100 μm and an acrylic resin adhesive deposited to a thickness of about 5 μm on the surface of the sheet-like base. The protective member adhering step may be carried out after a shield tunnel forming step, to be described later, has been performed.

Figure 3:
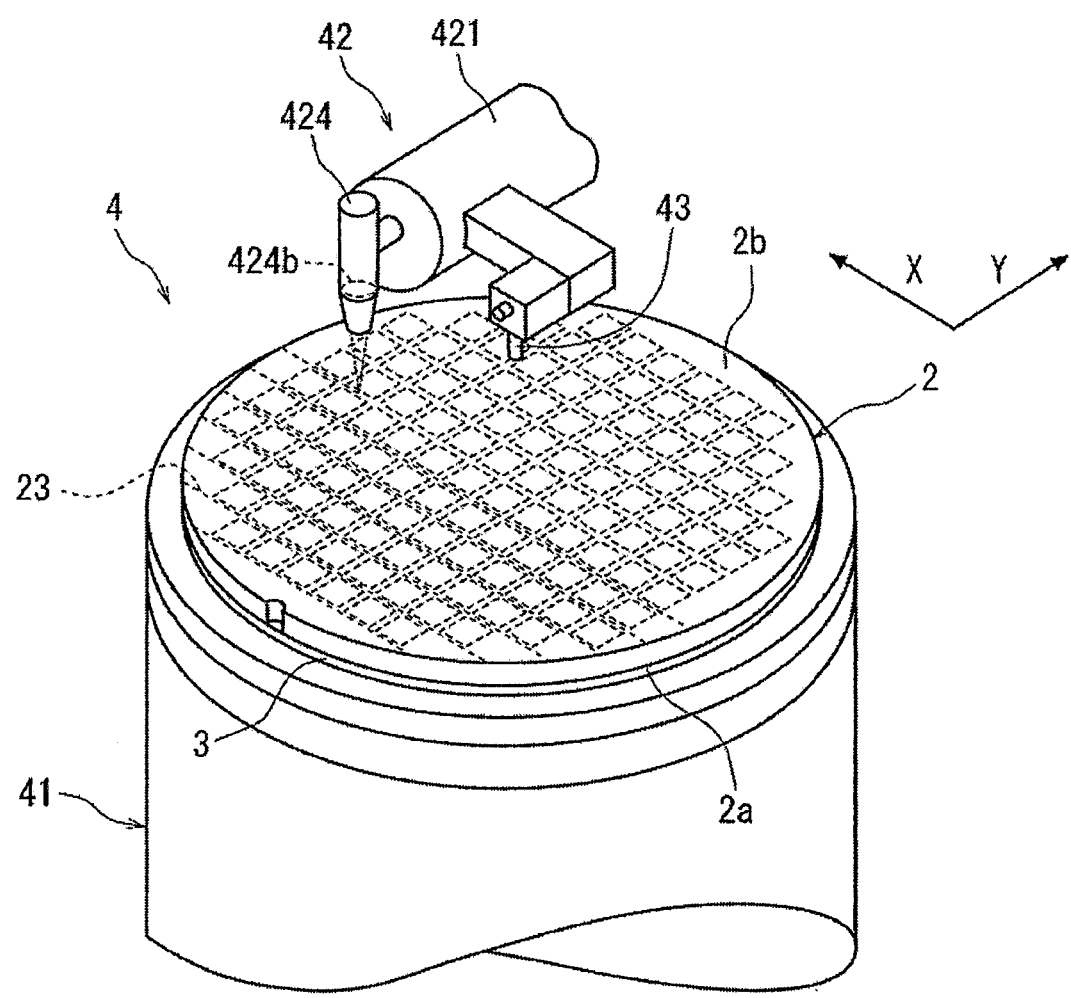
FIG. 3 is a perspective view of essential parts of a laser processing apparatus for performing a shield tunnel forming step.

After the protective member adhering step has been performed, a shield tunnel forming step is carried out to apply a pulsed laser beam having such a wavelength that permeates through the optical device wafer 2 which includes the sapphire ($Al_2O_3$) substrate as the single-crystal substrate along the division lines 21, forming shield tunnels, each including a fine hole and an amorphous region shielding the fine hole, along the division lines 21. According to the present embodiment, the shield tunnel forming step is performed using a laser processing apparatus 4 shown in FIG. 3. As shown in FIG. 3, the laser processing apparatus 4 includes a chuck table 41 that holds a workpiece thereon, laser beam applying means 42 that applies a laser beam to the workpiece held on the chuck table 41, and image capturing means 43 that captures an image of the workpiece held on the chuck table 41. The chuck table 41, which is arranged to hold the workpiece under suction, is movable along a processing feed direction indicated by the arrow X in FIG. 3 by processing feed means, not shown, and along an indexing feed direction indicated by the arrow Y in FIG. 3 by indexing feed means, not shown.

Figure 4:
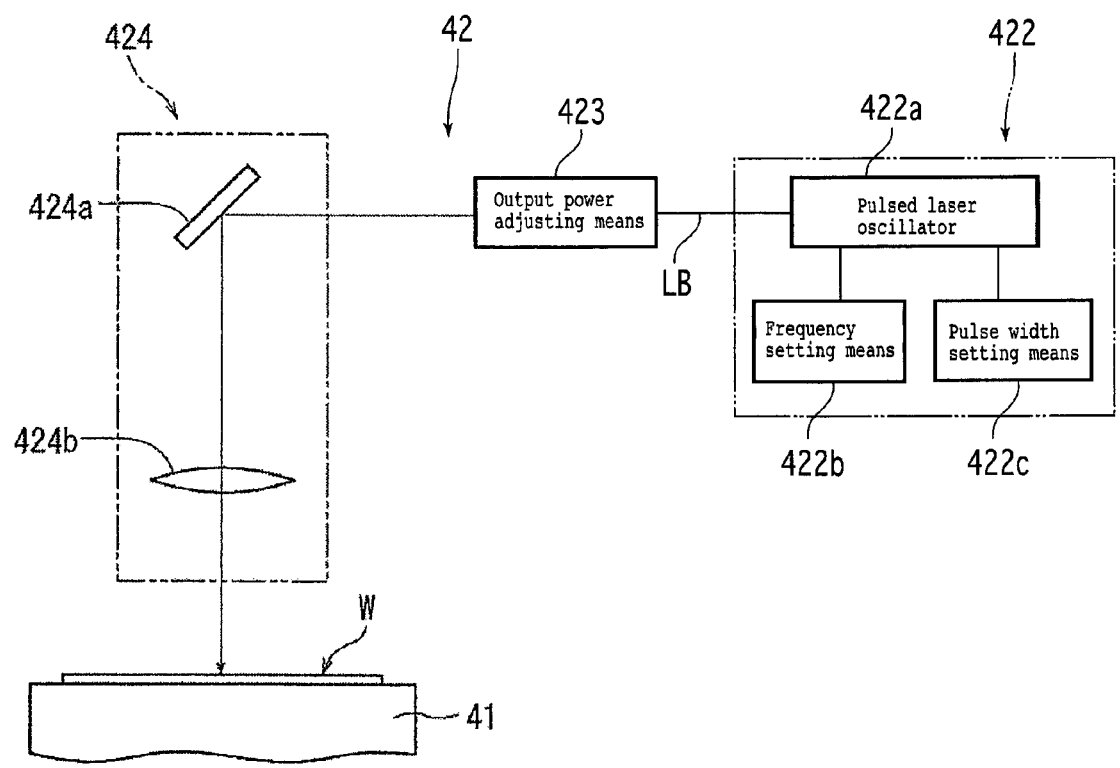
FIG. 4 is a block diagram of pulsed laser beam oscillating means included in the laser processing apparatus shown in FIG. 3.

The laser beam applying means 42 includes a casing 421 of a hollow cylindrical shape extending essentially horizontally. As shown in FIG. 4, the laser beam applying means 42 has pulsed laser beam oscillating means 422 disposed in the casing 421, output power adjusting means 423 for adjusting the output power of a pulsed laser beam emitted from the pulsed laser beam oscillating means 422, and a converging unit 424 for converging the pulsed laser beam whose output power has been adjusted by the output power adjusting means 423 and applying the converged pulsed laser beam to the optical device wafer 2 which is held as the workpiece on a holding surface that is provided as the upper surface of the chuck table 41. The pulsed laser beam oscillating means 422 includes a pulsed laser oscillator 422a, repetitive frequency setting means 422b for setting a repetitive frequency for the pulsed laser beam oscillated by the pulsed laser oscillator 422a, and pulse width setting means 422c for setting a pulse width for the pulsed laser beam oscillated by the pulsed laser oscillator 422a. According to the present embodiment, the pulsed laser beam oscillating means 422 thus arranged oscillates a pulsed laser beam LB having a wavelength of 1030 nm. The pulsed laser beam oscillating means 422 and the output power adjusting means 423 are controlled by control means, not shown.

The converging unit or condenser 424 includes a direction changing mirror 424a for changing the direction of the pulsed laser beam LB downwardly which has been emitted from the pulsed laser beam oscillating means 422 and whose output power has been adjusted by the output power adjusting means 423, and a condensing lens 424b for converging the pulsed laser beam LB which has been changed in direction by the direction changing mirror 424a and applying the converged pulsed laser beam to a workpiece W held on the holding surface as the upper surface of the chuck table 41. The present inventor has confirmed that a shield tunnel is formed insofar as a value generated by dividing the numerical aperture (NA) of the condensing lens 424b of the converging unit 424 by the refractive index (N) of the single-crystal substrate is in the range from 0.05 to 0.4. The relationship between the numerical aperture (NA), the refractive index (N), and the value (S=NA/N) generated by dividing the numerical aperture (NA) by the refractive index (N) will be described below with reference to FIG. 5.

Figure 5:
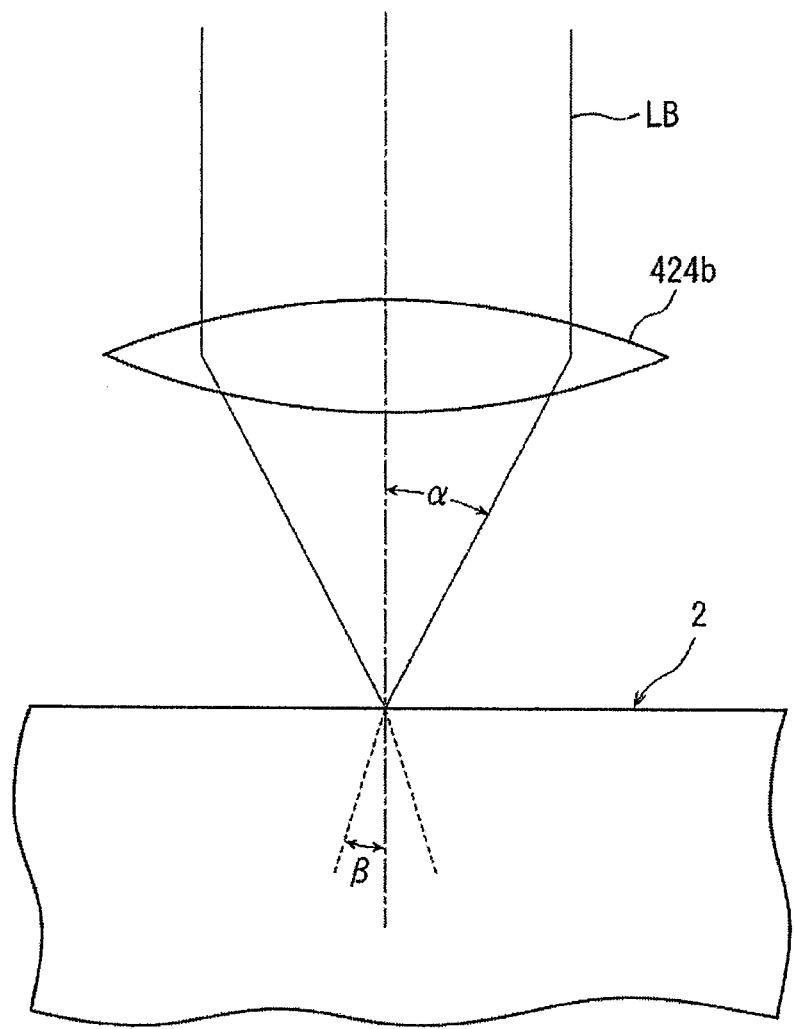
FIG. 5 is a diagram showing the relationship between the numerical aperture (NA) of a condensing lens, the refractive index (N) of an optical device wafer, and a value (S=NA/N) generated by dividing the numerical aperture (NA) by the refractive index (N)

In FIG. 5, the pulsed laser beam LB applied to the condensing lens 424b is converged at an angle (a) with respect to the optical axis of the condensing lens 424b. At this time, sin α represents the numerical aperture (NA) of the condensing lens 424b (NA=sin α). When the pulsed laser beam LB converged by the condensing lens 424b is applied to the optical device wafer 2 which includes the single-crystal substrate, since the single-crystal substrate of the optical device wafer 2 has its density higher than air, the pulsed laser beam LB is refracted from the angle (α) to an angle (β). At this time, the angle (β) with respect to the optical axis differs depending on the refractive index (N) of the single-crystal substrate of the optical device wafer 2. As the refractive index (N) is expressed as (N=sin α/sin β), the value (S=NA/N) generated by dividing the numerical aperture (NA) by the refractive index (N) of the single-crystal substrate is represented by sin β. It has been experimentally confirmed that a good shield tunnel is formed by setting sin β to the range from 0.05 to 0.4 (0.05≤sin β≤0.4), and that no good shield tunnel is formed if sin β falls outside the set range even though the peak energy density is in the range described later. The laser beam applying means 42 has converged point position adjusting means (not shown) for adjusting the position of the converged point of the pulsed laser beam that is converged by the condensing lens 424b of the converging unit 424.

The image capturing means 43, which is mounted on a distal end portion of the casing 421 of the laser beam applying means 42, includes, other than an ordinary image capturing device (CCD) which captures an image with a visible light beam, infrared radiation applying means for applying an infrared radiation to the workpiece, an optical system for capturing the infrared radiation applied by the infrared radiation applying means, and an image capturing device (infrared CCD) for outputting an electric signal depending on the infrared radiation captured by the optical system. The image capturing means 43 sends a captured image signal to the control means, not shown.

For laser-processing the optical device wafer 2, on which the wafer supporting step has been performed, along the division lines 21 using the laser processing apparatus 4, the protective tape 3 to which the optical device wafer 2 has been adhered is placed on the chuck table 41 of the laser processing apparatus 4 shown in FIG. 3. Suction means, not shown, is actuated to hold the optical device wafer 2 on the chuck table 41 under suction through the intermediary of the protective tape 3 (wafer holding step). With the optical device wafer 2 held on the chuck table 41, therefore, the optical device wafer 2 has its reverse side 2b facing upwardly. The chuck table 41 which has thus held the optical device wafer 2 under suction is positioned immediately below the image capturing means 43 by the processing feed means, not shown.

When the chuck table 41 is positioned immediately below the image capturing means 43, the image capturing means 43 and the non-illustrated control means carry out an alignment process to detect an area to be laser-processed of the optical device wafer 2. Specifically, the image capturing means 43 and the non-illustrated control means perform an image processing process such as pattern matching or the like to position a division line 21 along a first direction on the optical device wafer 2 and the converging unit 424 of the laser beam applying means 42 which applies the laser beam along the division line 21, with respect to each other, thereby aligning a laser beam applying position (alignment step). A laser beam applying position is similarly aligned with respect to a division line 21 that extends on the optical device wafer 2 perpendicularly to the above first direction. In the alignment step, the division lines 21 on the optical device wafer 2 and the optical devices 22 are positioned downwardly. Since the image capturing means 43 includes the infrared radiation applying means, the optical system for capturing the infrared radiation, and the image capturing device (infrared CCD) for outputting an electric signal depending on the infrared radiation, as described above, the image capturing means 43 can capture an image of the division line 21 through the optical device wafer 2 which includes the sapphire ($Al_2O_3$) substrate as a single-crystal substrate, from the reverse side 2b of the optical device wafer 2.

Figure 6A:
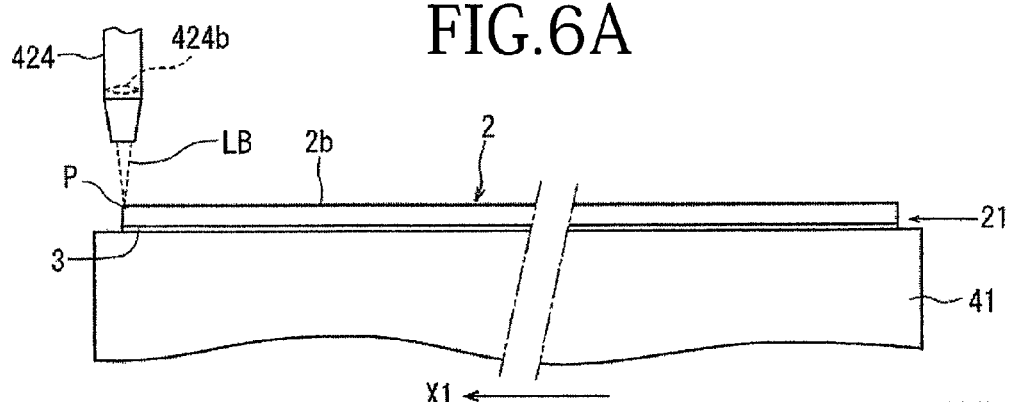
FIGS. 6A through 6E are views illustrating the shield tunnel forming step.

After the above alignment step has been carried out, as shown in FIG. 6A, the chuck table 41 is moved to a laser beam applying area where the converging unit 424 of the laser beam applying means 42 that applies the laser beam is positioned, positioning the predetermined division line 21 immediately below the converging unit 424. At this time, as shown in FIG. 6A, one end (left end in FIG. 6A) of the division line 21 on the optical device wafer 2 is positioned immediately below the converging unit 424. Then, the non-illustrated converged point position adjusting means is actuated to move the converging unit 424 along the optical axis in order to position a converged point P of the pulsed laser beam LB converged by the condensing lens 424b of the converging unit 424 at a desired position along the thickness-wise direction of the optical device wafer 2 from the reverse side 2b thereof (positioning step). According to the present embodiment, the converged point P of the pulsed laser beam LB is set to the desired position that is spaced from the reverse side 2b of the optical device wafer 2 which includes the sapphire ($Al_2O_3$) substrate as a single-crystal substrate to which the pulsed laser beam LB is applied (e.g., a position spaced 5 μm through 10 μm from the reverse side 2b toward the surface 2a).

Figure 6B:
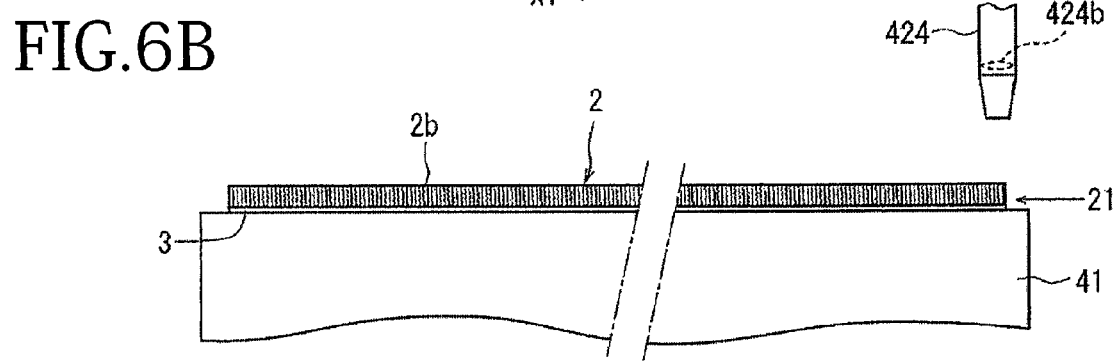

After the positioning step has been carried out as described above, a shield tunnel forming step is carried out to operate the laser beam applying means 42 to emit the laser beam LB from the converging unit 424 and form, in the optical device wafer 2 which includes the sapphire ($Al_2O_3$) substrate as a single-crystal substrate, a fine hole and an amorphous region shielding the fine hole which extend from a region in the vicinity of the converged point P (reverse side 2b) toward the surface 2a, thereby forming a shield tunnel in the optical device wafer 2. Specifically, while the converging unit 424 is emitting the pulsed laser beam LB which has such a wavelength that permeates through the sapphire ($Al_2O_3$) substrate of the optical device wafer 2, the chuck table 41 is moved at a predetermined feed speed along the direction indicated by the arrow X1 in FIG. 6A (shield tunnel forming step). Then, as shown in FIG. 6B, when the other end (right end in FIG. 6B) of the division line 21 reaches the laser beam applying position of the converging unit 424 of the laser beam applying means 42, the laser beam applying means 42 stops applying the pulsed laser beam, and the chuck table 41 stops moving.

Figure 6C:
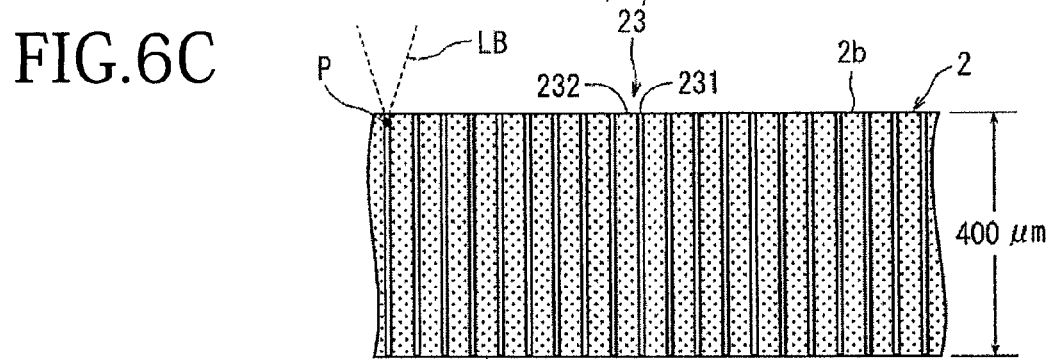
Figures 6D, 6E:
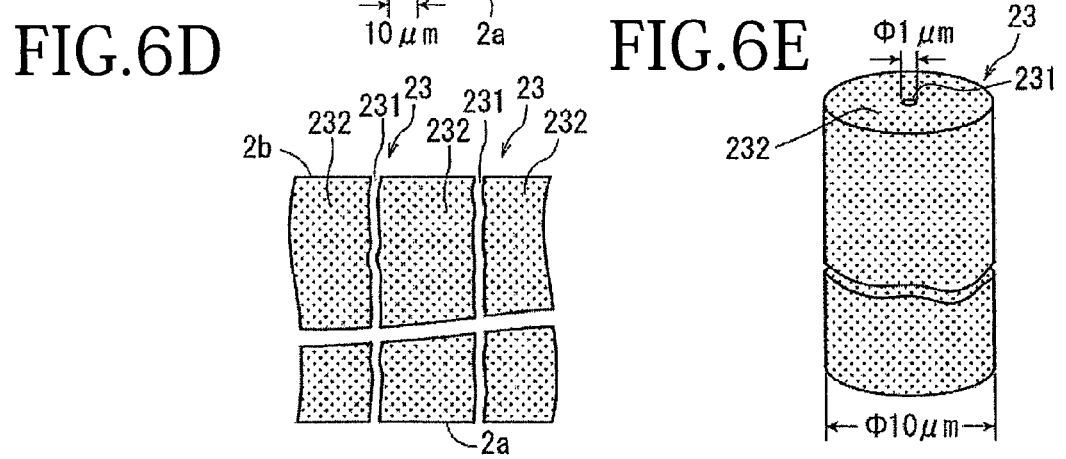

When the above shield tunnel forming step is carried out, as shown in FIG. 6C, fine holes 231 and amorphous regions 232 formed around the fine holes 231 are grown in the optical device wafer 2 which includes the sapphire ($Al_2O_3$) substrate as a single-crystal substrate such that they extend from a region in the vicinity of the converged point P (reverse side 2b) of the pulse laser beam LB toward the surface 2a, thereby forming amorphous shield tunnels 23 at predetermined intervals (according to the present embodiment, intervals of 10 μm (processing feed speed: 1000 mm/second)/(repetitive frequency: 100 kHz)) along the division line 21. As shown in FIGS. 6D and 6E, each of the shield tunnels 23 includes a centrally formed fine hole 231 having a diameter of about 1 µm and an amorphous region 232 having a diameter of about 10 µm disposed around the fine hole 231. According to the present embodiment, those amorphous regions 232 which are disposed adjacent to each other are joined to each other. Since the amorphous shield tunnels 23 formed in the shield tunnel forming step can be formed so as to extend from the reverse side 2b of the optical device wafer 2 which includes the sapphire (Al$_2$O$_3$) substrate as a single-crystal substrate toward the surface 2a thereof, the pulsed laser beam LB may be applied only once even if the thickness of the optical device wafer 2 is large. Therefore, the productivity of the shield tunnels 23 is highly increased.

After the shield tunnel forming step has been carried out along the predetermined division line 21, the chuck table 41 is indexed by the interval between division lines 21 on the optical device wafer 2 along the direction indicated by the arrow Y (indexing step), and then the above shield tunnel forming step is performed. When the shield tunnel forming step has been carried out along all the division lines 21 that extend along the first direction, the chuck table 41 is turned 90 degrees, and then the shield tunnel forming step is carried out along the division lines 21 which extend along a direction perpendicular to the division lines 21 along the first direction.

In order to form good shield tunnels 23 in the above shield tunnel forming step, it is important to set the peak energy density of the pulsed laser beam LB to a value in a range from 1 TW/cm$^2$ to 100 TW/cm$^2$. The peak energy density can be determined as average output power (W)/{repetitive frequency (Hz)×spot area (cm$^2$)×pulse width (s)}.

The reasons why the peak energy density of the pulsed laser beam LB is set to a value in the range from 1 TW/cm$^2$ to 100 TW/cm$^2$ will be described below.

[Experiment 1]

Condition 1 . . . single-crystal substrate: sapphire substrate (having a thickness of 400 µm)

Condition 2 . . . the wavelength of the pulsed laser beam is set to 1030 nm

Condition 3 . . . the repetitive frequency of the pulsed laser beam is set to 100 kHz Condition 4 . . . the spot diameter of the pulsed laser beam is set to 10 µm Condition 5 . . . the average output power of the pulsed laser beam is set to 5 W Condition 6 . . . variable: the pulse width of the pulsed laser beam The pulsed laser beam was applied to the sapphire substrate while the pulse width was varied from 0.1 ps to 100 ps under the above conditions, and the processed state was observed.

When the pulse width ranged from 0.1 ps to 0.6 ps, voids were formed within the sapphire substrate.

When the pulse width ranged from 0.7 ps to 63 ps, shield tunnels including fine holes and amorphous regions shielding the fine holes were formed within the sapphire substrate.

When the pulse width ranged from 64 ps to 100 ps, the inside of the sapphire substrate was melted.

It can be seen from the above experimental results that shield tunnels including fine holes and amorphous regions shielding the fine holes are formed within the sapphire substrate when the pulse width is in the range from 0.7 ps to 63 ps.

Consequently, the peak energy density is determined with the pulse width in the range from 0.7 ps to 63 ps under the above conditions, and shield tunnels are formed by setting the peak energy density to a value in the range from 1 TW/cm$^2$ to 100 TW/cm$^2$.

[Experiment 2]

Condition 1 . . . single-crystal substrate: sapphire substrate (having a thickness of 400 µm)

Condition 2 . . . the wavelength of the pulsed laser beam is set to 1030 nm

Condition 3 . . . the pulse width is set to 10 ps

Condition 4 . . . the spot diameter of the pulsed laser beam is set to 10 µm

Condition 5 . . . the average output power of the pulsed laser beam is set to 5 W Condition 6 . . . variable: the repetitive frequency of the pulsed laser beam The pulsed laser beam was applied to the sapphire substrate while the repetitive frequency was varied from 1 kHz to 1000 kHz under the above conditions, and the processed state was observed.

When the repetitive frequency ranged from 1 kHz to 6 kHz, the inside of the sapphire substrate was broken and cracks were radially developed therein.

When the repetitive frequency ranged from 7 kHz to 640 kHz, shield tunnels including fine holes and amorphous regions shielding the fine holes were formed within the sapphire substrate.

When the repetitive frequency ranged from 650 kHz to 1000 kHz, voids were formed within the sapphire substrate and no shield tunnels were formed therein.

It can be seen from the above experimental results that shield tunnels including fine holes and amorphous regions shielding the fine holes are formed within the sapphire substrate when the repetitive frequency is in the range from 7 kHz to 640 kHz.

Consequently, the peak energy density is determined with the repetitive frequency in the range from 7 kHz to 640 kHz under the above conditions, and shield tunnels are formed by setting the peak energy density to a value in the range from 1 TW/cm$^2$ to 100 TW/cm$^2$.

The above described Experiment 1 and Experiment 2 were conducted on the sapphire (Al$_2$O$_3$) substrate. Experiments similar to Experiment 1 and Experiment 2 were also conducted on a silicon carbide (SiC) substrate, a gallium nitride (GaN) substrate, a lithium tantalate (LiTaO$_3$) substrate, a lithium niobate (LiNbO$_3$) substrate, a diamond substrate, and a quartz (SiO$_2$) substrate, each as a single-crystal substrate, and the results of those experiments were essentially the same.

Figure 7A:
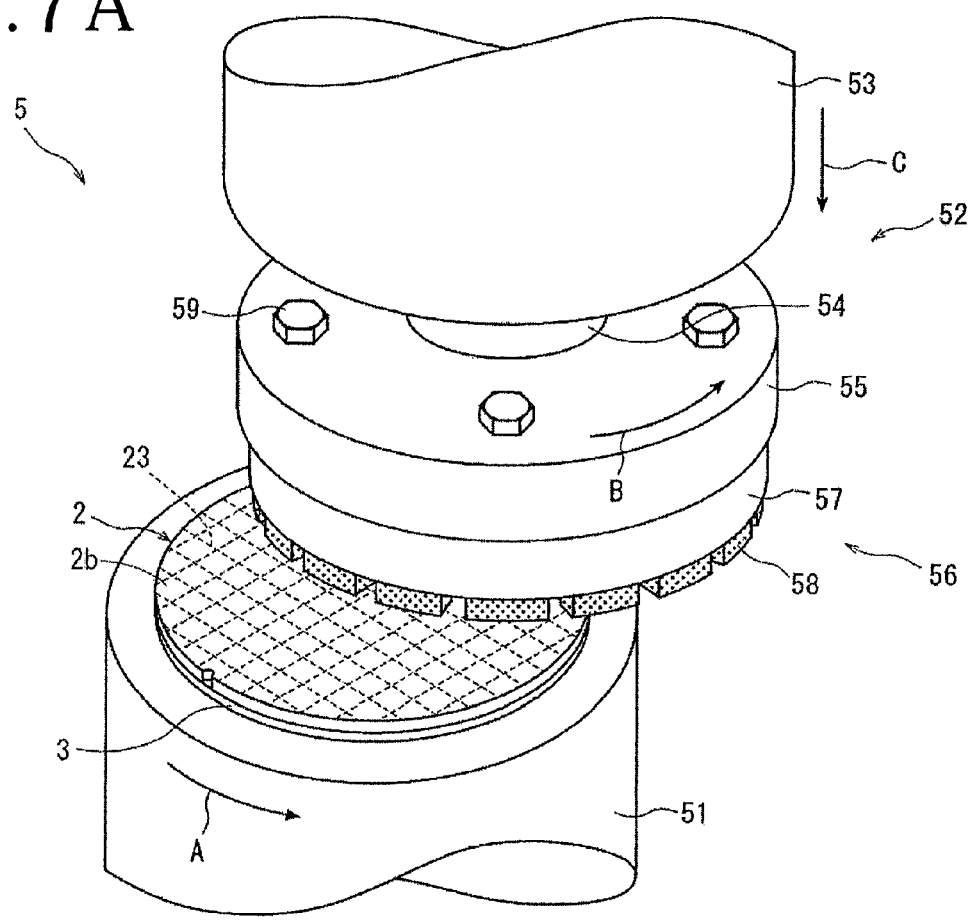
FIGS. 7A and 7B are views illustrating a grinding step.

After the above shield tunnel step has been carried out, a grinding step is carried out to hold the protective member adhered to the surface 2a of the optical device wafer 2 which includes the sapphire (Al$_2$O$_3$) substrate as a single-crystal substrate on a chuck table of a grinding apparatus, grind the reverse side 2b of the optical device wafer 2 to bring the optical device wafer 2 to a predetermined thickness, and divide the optical device wafer 2 along the division lines 21 along which the shield tunnels 23 have been formed. The grinding step is performed using a grinding apparatus 5 shown in FIG. 7A. As shown in FIG. 7A, the grinding apparatus 5 includes a chuck table 51 as holding means for holding a workpiece thereon and grinding means 52 for grinding the workpiece that is held on the chuck table 51. The chuck table 51, which is arranged to hold the workpiece on its upper surface under suction, is rotated about its own axis in the direction indicated by the arrow A in FIG. 7A by a rotational drive mechanism, not shown. The grinding means 52 includes a spindle housing 53, a rotational spindle 54 rotatably supported by the spindle housing 53 and rotatable about its own axis by a rotational drive mechanism, not shown, a mounter 55 mounted on the lower end of the rotational spindle 54, and a grinding wheel 56 attached to the lower surface of the mounter 55. The grinding wheel 56 includes an annular base 57 and a plurality of grinding stones 58 mounted in an annular pattern on the lower surface of the base 57. The base 57 is fastened to the lower surface of the mounter 55 by fastening bolts 59.

Figure 7B:
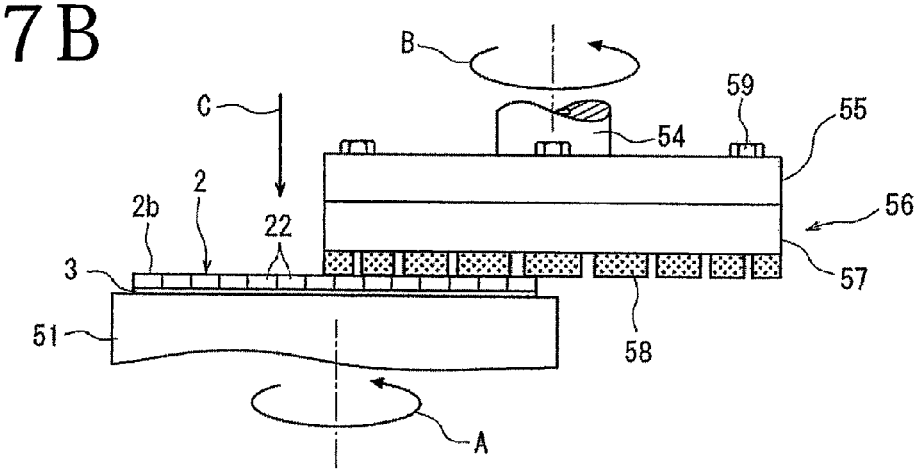

For performing the grinding step using the grinding apparatus 5, the protective tape 3 adhered to the surface 2a of the optical device wafer 2 is placed on the upper surface (holding surface) of the chuck table 51, as shown in FIG. 7A. Then, suction means, not shown, is actuated to hold the optical device wafer 2 on the chuck table 51 under suction through the intermediary of the protective tape 3 (wafer holding step). Therefore, the optical device wafer 2 held on the chuck table 51 has its reverse side 2b facing upwardly. After the optical device wafer 2 has been held on the chuck table 51 under suction through the intermediary of the protective tape 3, the grinding wheel 56 of the grinding means 52 is rotated about its own axis at 6000 rpm, for example, in the direction indicated by the arrow B in FIG. 7A while the chuck table 51 is being rotated about its own axis at 300 rpm, for example, in the direction indicated by the arrow A in FIG. 7A, and the grinding stones 58 are brought into contact with the reverse side 2b, which is a surface to be processed, of the optical device wafer 2, as shown in FIG. 7B, whereupon the grinding wheel 56 is fed a predetermined distance downwardly (a direction perpendicular to the holding surface of the chuck table 51) at a grinding feed speed of 1 μm/second, for example, as indicated by the arrow C. As a result, the reverse side 2b of the optical device wafer 2 is ground to bring the optical device wafer 2 to a predetermined thickness (e.g., 100 μm) and the optical device wafer 2 is divided into individual optical devices 22 along the division lines 21 where the mechanical strength is lowered by the shield tunnels 23 formed therein. Since the protective tape 3 is adhered to the surfaces of the individual optical devices 22 which have been separated, the optical devices 22 do not fall apart, but remain joined together in the shape of the optical device wafer 2. When the grinding step is thus carried out, the optical device wafer 2 is divided into individual optical devices 22 along the division lines 21 where the mechanical strength is lowered by the shield tunnels 23 formed therein.

Figure 8:
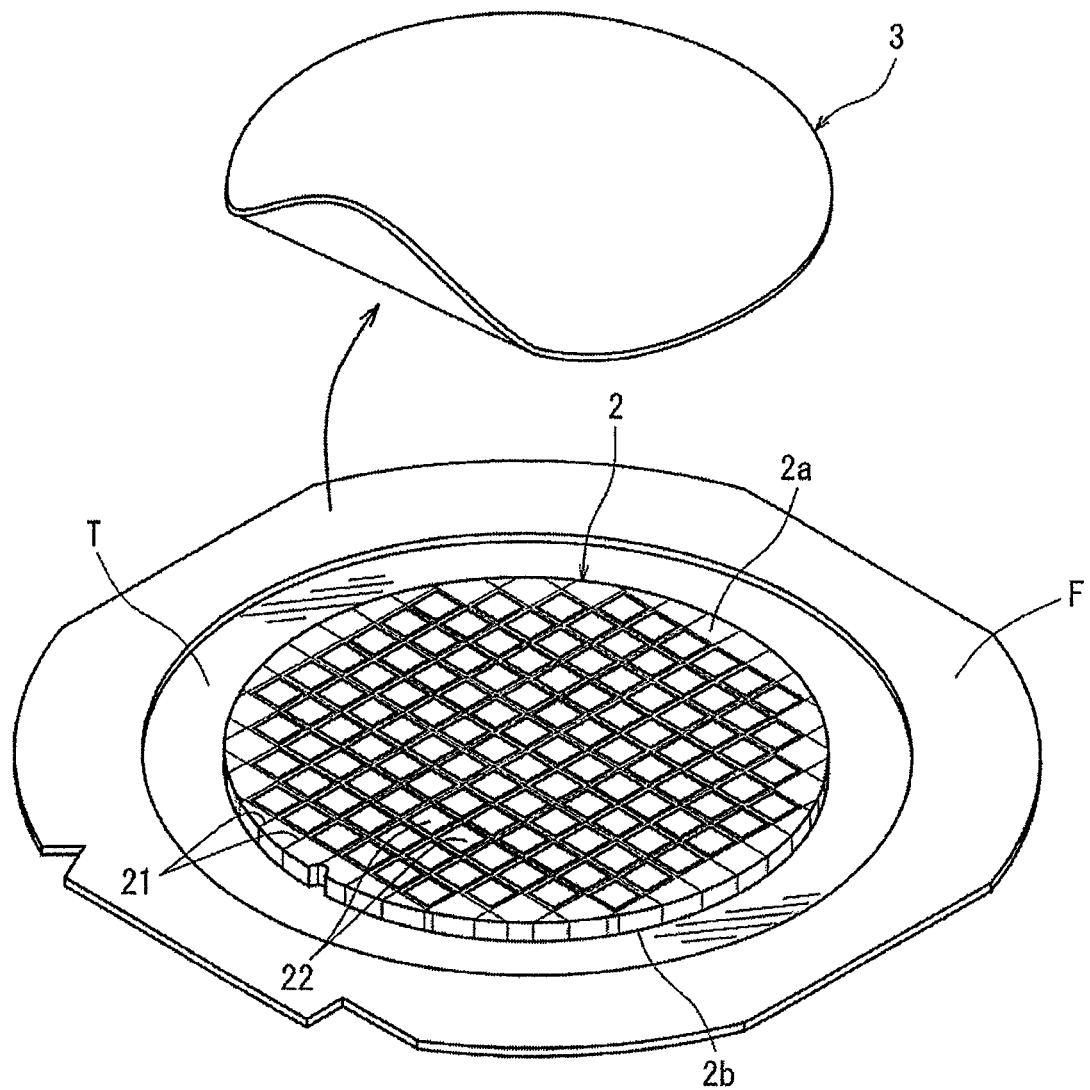
FIG. 8 is a perspective view showing the manner in which an optical device wafer on which the shield tunnel forming step has been performed is adhered to a dicing tape mounted on an annular frame.

Then, a wafer supporting step is carried out to adhere a dicing tape to the reverse side 2b of the optical device wafer 2 which includes the sapphire ($Al_2O_3$) substrate as a single-crystal substrate (divided into the individual optical devices 22) on which the grinding step has been performed, and support an outer circumferential portion of the dicing tape on an annular frame. Specifically, as shown in FIG. 8, the reverse side 2b of the optical device wafer 2 that has been divided into the individual optical devices 22 on which the grinding step has been performed is adhered to the surface of a dicing tape T whose outer circumferential portion has been mounted on an annular frame F in covering relation to an inner opening thereof. Then, the protective tape 3 adhered to the surface 2a of the optical device wafer 2 is peeled off. With the optical device wafer 2 adhered to the surface of the dicing tape T, therefore, the optical device wafer 2 has its surface 2a facing upwardly.

Figure 9:
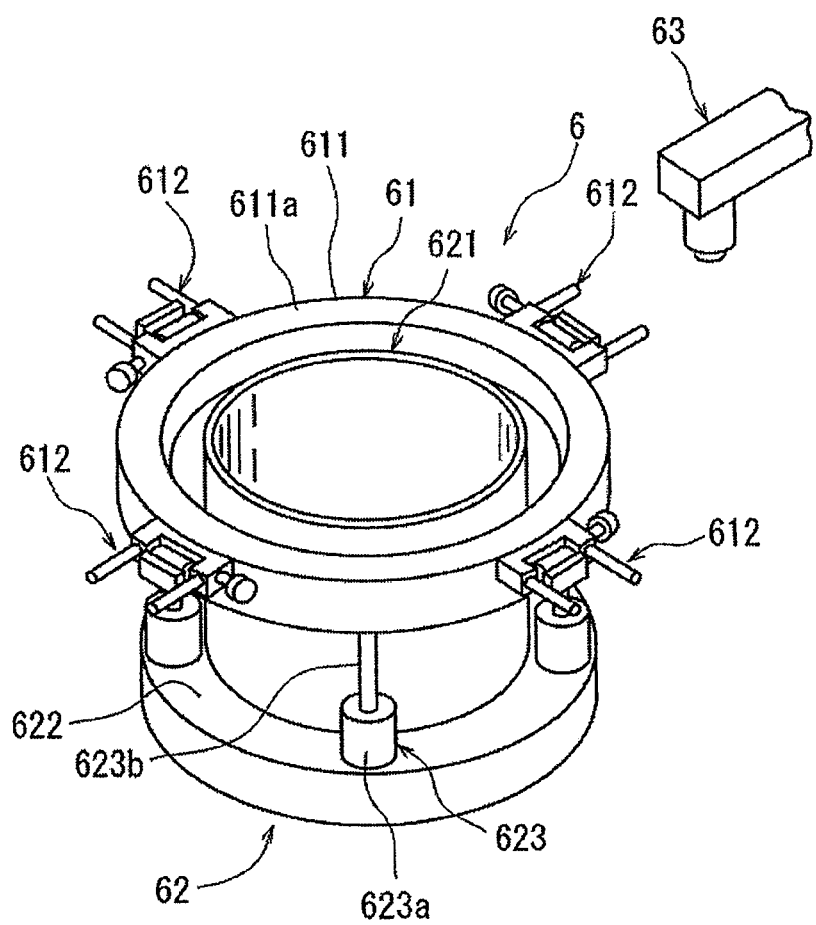
FIG. 9 is a perspective view of a pickup apparatus for picking up individual optical devices into which an optical device wafer is divided.

After the wafer supporting step has been performed, a pickup step is carried out to pick up the individual optical devices 22 divided from the optical device wafer 2 adhered to the dicing tape T. The pickup step is carried out using a pickup apparatus 6 shown in FIG. 9. As shown in FIG. 9, the pickup apparatus 6 includes frame holding means 61 for holding the annular frame F, tape expanding means 62 for expanding the optical device wafer 2 mounted on the annular frame F that is held by the frame holding means 61, and a pickup collet 63. The frame holding means 61 includes annular frame holding member 611 and a plurality of clamps 612 disposed as fixing means on an outer circumferential surface of the frame holding member 611. The frame holding member 611 has an upper surface serving as a placement surface 611a for placing the annular frame F thereon. The annular frame F is placed on the placement surface 611a. The annular frame F that is placed on the placement surface 611a is fixed to the frame holding member 611 by the clamps 612. The frame holding means 61 thus constructed is supported by the tape expanding means 62 for vertical back-and-forth movement.

The tape expanding means 62 has an expanding drum 621 disposed in the annular frame holding member 611. The expanding drum 621 has an outside diameter smaller than the inside diameter of the annular frame F and an inside diameter larger than the outside diameter of the optical device wafer 2 adhered to the dicing tape T which is mounted on the annular frame F. The expanding drum 621 has a support flange 622 on its lower end. The tape expanding means 62 according to the present embodiment has support means 623 for vertically moving the annular frame holding member 611 back and forth. The support means 623 includes a plurality of air cylinders 623a disposed on the support flange 622 and having respective piston rods 623b connected to the lower surface of the annular frame holding member 611. The support means 623 which includes the air cylinders 623a moves the annular frame holding member 611 vertically between a reference position shown in FIG. 10A in which the placement surface 611a lies substantially at the same height as the upper end of the expanding drum 621 and an expanding position shown in FIG. 10B in which the placement surface 611a is a predetermined distance lower than the upper end of the expanding drum 621.

Figure 10A:
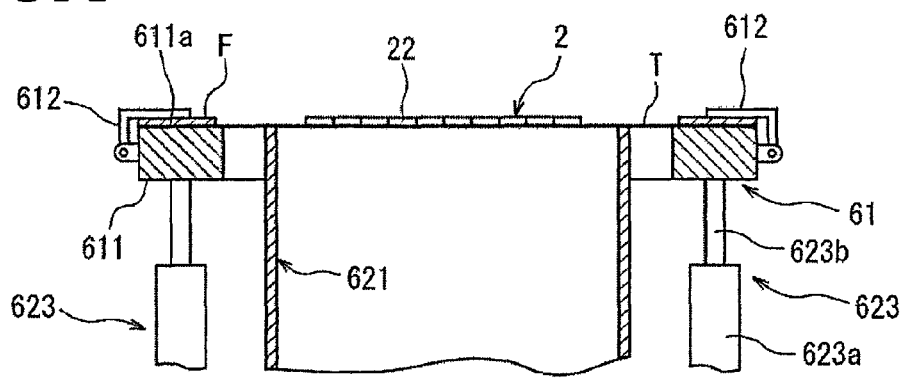
FIGS. 10A through 10C are views illustrating a pickup step which is carried out by the pickup apparatus shown in FIG. 9.
Figure 10B:
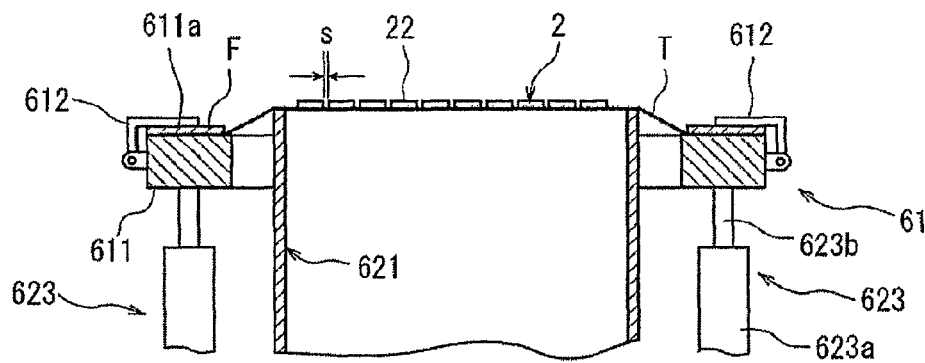

The pickup step to be carried out using the pickup apparatus 6 thus constructed will be described below with reference to FIGS. 10A through 10C. As shown in FIG. 10A, the annular frame F on which the dicing tape T with the optical device wafer 2 adhered thereto is mounted is placed on the placement surface 611a of the frame holding member 611 of the frame holding means 61, and is then fixed to the frame holding member 611 by the clamps 612 (frame holding step). At this time, the frame holding member 611 is positioned in the reference position shown in FIG. 10A. Thereafter, the air cylinders 623a of the support means 623 of the tape expanding means 62 are actuated to lower the annular frame holding member 611 to the expanding position shown in FIG. 10B. Since the annular frame F fixed to the placement surface 611a of the frame holding member 611 is also lowered, the dicing tape T mounted on the annular frame F is expanded by contact with the upper end of the expanding drum 621 (tape expanding step), as shown in FIG. 10B. As a result, the optical device wafer 2 adhered to the dicing tape T is subjected to a radial tensile force which separates the divided individual optical devices 22, forming widened gaps S between the optical devices 22.

Figure 10C:
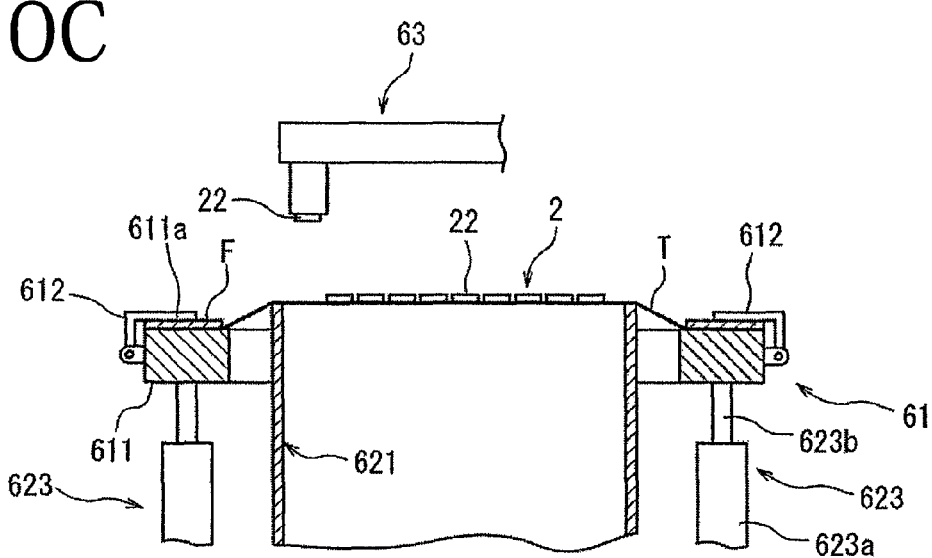

Then, as shown in FIG. 10C, the pickup collet 63 is actuated to attract one at a time of the optical devices 22 and pick it up from the dicing tape T (pickup step), and delivers the picked-up optical device 22 to a tray, not shown, or a die bonding step. In the pickup step, since the widened gaps S are formed between the individual optical devices 22 adhered to the dicing tape T as described above, the pickup collet 63 can easily pick up each optical device 22 without contact with the adjacent optical devices 22.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a single-crystal substrate to divide the single-crystal substrate along a plurality of preset division lines, comprising:
    a shield tunnel forming step of applying a pulsed laser beam to the single-crystal substrate along the division lines to form shield tunnels, which each include a fine hole and an amorphous region shielding the fine hole, in the single-crystal substrate along the division lines, wherein the pulsed laser beam has a wavelength that is configured to permeate through the single-crystal substrate;
    a protective member adhering step of adhering a protective member to the single-crystal substrate; and
    a grinding step of holding the protective member on the single-crystal substrate, to which the shield tunnel forming step and the protective member adhering step have been performed, on a chuck table of a grinding apparatus, grinding a reverse surface of the single-crystal substrate to bring the single-crystal substrate to a predetermined thickness, and dividing the single-crystal substrate along the division lines along which the shield tunnels have been formed,
    wherein the amorphous regions and the fine holes of the shield tunnels are formed by the pulsed laser beam during the shield tunnel forming step.

2. The method of processing the single-crystal substrate according to claim 1, wherein the pulsed laser beam used in the shield tunnel forming step has a peak energy density set to a value in a range from 1 TW/cm$^2$ to 100 TW/cm$^2$.

3. The method of processing the single-crystal substrate according to claim 1, wherein the protective member adhering step is performed before the shield tunnel forming step.

4. The method of processing the single-crystal substrate according to claim 1, wherein the protective member adhering step is performed after the shield tunnel forming step.

5. The method of processing the single-crystal substrate according to claim 1, wherein the amorphous region extends from a front surface of the single-crystal substrate to the reverse surface of the single-crystal substrate.

6. The method of processing the single-crystal substrate according to claim 1, wherein the amorphous region extends from a front surface of the single-crystal substrate towards the reverse surface of the single-crystal substrate.

7. The method of processing the single-crystal substrate according to claim 1, wherein the pulsed laser beam used in the shield tunnel forming step has a pulse width within the range of 0.7 ps to 63 ps.

8. The method of processing the single-crystal substrate according to claim 1, wherein the pulsed laser beam used in the shield tunnel forming step has a spot diameter of 10 μm.

9. The method of processing the single-crystal substrate according to claim 1, wherein the pulsed laser beam used in the shield tunnel forming step has an average output power of 5 W.

10. The method of processing the single-crystal substrate according to claim 1, wherein the pulsed laser beam used in the shield tunnel forming step has:
    a pulse width within the range of 0.7 ps to 63 ps;
    a spot diameter of 10 μm; and
    an average output power of 5 W.

11. The method of processing the single-crystal substrate according to claim 1, wherein the fine holes formed during the shield tunnel forming step are formed at predetermined intervals.

12. The method of processing the single-crystal substrate according to claim 11, wherein each of the predetermined intervals is 10 μm.

13. The method of processing the single-crystal substrate according to claim 1, wherein the fine hole in each of said shield tunnels has a diameter of about 1 μm.

14. The method of processing the single-crystal substrate according to claim 13, wherein the amorphous region surrounding the fine hole in each of said shield tunnels has a diameter of about 10 μm.

15. The method of processing the single-crystal substrate according to claim 1, wherein the amorphous region of each of said shield tunnels is generally cylindrical-shaped.

* * * * *